US010277337B2

United States Patent
Bai (10) Patent No.: US 10,277,337 B2
(45) Date of Patent: Apr. 30, 2019

(54) ANTENNA TEST METHODS AND APPARATUSES FOR MOBILE TERMINALS

(71) Applicant: Huizhou TCL Mobile Communication Co., Ltd, Huizhou, Guangdong (CN)

(72) Inventor: Jian Bai, Huizhou (CN)

(73) Assignee: HUIZHOU TCL MOBILE COMMUNICATION CO., LTD., Huizhou, Guangdong Province (CN)

( * ) Notice: Subject to any disclaimer, the term of this patent is extended or adjusted under 35 U.S.C. 154(b) by 200 days.

(21) Appl. No.: 15/119,851

(22) PCT Filed: Oct. 20, 2015

(86) PCT No.: PCT/CN2015/092277
§ 371 (c)(1),
(2) Date: Aug. 18, 2016

(87) PCT Pub. No.: WO2016/176968
PCT Pub. Date: Nov. 10, 2016

(65) Prior Publication Data
US 2018/0183530 A1   Jun. 28, 2018

(30) Foreign Application Priority Data
May 5, 2015  (CN) .......................... 2015 1 0223689

(51) Int. Cl.
  *G01R 29/10* (2006.01)
  *H04B 17/12* (2015.01)
  *H04B 17/309* (2015.01)
(52) U.S. Cl.
  CPC ........... *H04B 17/12* (2015.01); *G01R 29/105* (2013.01); *H04B 17/309* (2015.01)

(58) Field of Classification Search
CPC .... G01R 29/105; H04B 17/00; H04B 17/102; H04B 17/103; H04B 17/15; H04B 17/16; H04B 17/309
(Continued)

(56) References Cited

U.S. PATENT DOCUMENTS

2006/0194553 A1* 8/2006 Ozaki .................... G01R 29/10
                                                                  455/226.1
2007/0207756 A1   9/2007 Qi et al.
(Continued)

FOREIGN PATENT DOCUMENTS

CN         102244549 A     11/2011
CN         104168074 A     11/2014
(Continued)

OTHER PUBLICATIONS

International Search Report on corresponding PCT application (PCT/CN2015/092277) from International Searching Authority (CN) dated Feb. 17, 2016.

*Primary Examiner* — Simon Nguyen
(74) *Attorney, Agent, or Firm* — Cheng-Ju Chiang (57) ABSTRACT

An antenna test method and apparatus are disclosed. The antenna test method includes: A, placing a mobile terminal on a turntable in an anechoic chamber, and connecting the mobile terminal to a base station emulator via an anechoic chamber communication antenna; B, moving by the turntable sequentially to multiple theta and phi angles, transmitting by the base station emulator signals to the mobile terminal via an anechoic chamber measurement antenna, and receiving and decoding by the mobile terminal the signals and transmitting them back to the base station emulator, to obtain the horizontal and vertical polarization data of the anechoic chamber measurement antenna at steps of a first angle; C, performing interpolations to calculate the corresponding data at steps of a second angle as the step
(Continued)

converts from the first angle to the second angle, and using the derived data to calculate the Total Isotropic Sensitivity (TIS).

16 Claims, 2 Drawing Sheets

(58) Field of Classification Search
USPC .......................................... 455/67.12, 226.1
See application file for complete search history.

(56) References Cited

U.S. PATENT DOCUMENTS

| | | | |
|---|---|---|---|
| 2008/0129615 A1* | 6/2008 | Breit | G01R 29/105 343/703 |
| 2008/0311871 A1* | 12/2008 | Qi | H04B 17/29 455/226.2 |
| 2011/0299570 A1* | 12/2011 | Reed | H04B 7/0434 375/130 |
| 2015/0099473 A1* | 4/2015 | Szini | H04W 24/06 455/67.12 |
| 2015/0263815 A1 | 9/2015 | Bai | |

FOREIGN PATENT DOCUMENTS

| | | |
|---|---|---|
| CN | 104931811 A | 9/2015 |
| JP | 2011019031 A | 1/2011 |
| JP | 2012090049 A | 5/2012 |

\* cited by examiner

ANTENNA TEST METHODS AND APPARATUSES FOR MOBILE TERMINALS

FIELD OF THE DISCLOSURE

The present disclosure relates to antenna measurement, and more particularly, to antenna test methods and apparatuses for mobile terminals.

BACKGROUND OF THE DISCLOURE

The antenna performance of mobile terminals has become increasingly important since it comes to the 4G era. Superior antenna performance can bring the users satisfactory mobile broadband experiences, in particular, a preferable receptivity can offer faster download speeds. To improve the antenna performance, the antenna test system is an imperative test platform which plays an indispensable role in the research and development. A typical antenna design loop may include antenna pattern design, test, optimization according to the test results, and re-test, until the optimum performance is achieved. Throughout the whole loop, the test, especially the Total Isotropic Sensitivity (TIS) test is extremely time consuming. In a typical TIS test, the theta angle of the antenna's turntable needs to be adjusted from 0 to 180° at 30° intervals, meanwhile the angle phi thereof needs to be adjusted from 0 to 360° also at 30° intervals, such that the total test duration for a single channel can be up to 60 minutes. Nevertheless, high-efficiency antenna test systems can help the developers obtain the optimum antenna performance in the shortest time.

In fact, the frequency bands and formats of mobile terminals have largely increased since the 4G era, in contrast with the past. For example, a typical mobile terminal featuring 5 modes and 12 frequency bands with China Mobile can support a total of 5 modes including GSM/WCDMA/TD-SCDMA/FDD-LTE/TDD-LTE, and 12 frequency bands including B1/2/3/7/5/8/17/34/39/38/40/41, providing a coverage ranging from 700 MHz to 2.6 GHz, leading however to a significant increase in the test difficulty and duration. Using the standard over-the-air (OTA) test methodology mandated by Cellular Telecommunications and Internet Association (CTIA) criteria to measure performances including the Total Radiated Power (TRP) and the Total Isotropic Sensitivity (TIS) for the 12 frequency bands, an average of 12×90×3 minutes, i.e., 3240 minutes=54 hours would be required (For each channel, the TRP measurement would take 30 minutes, whilst the TIS 60 minutes, and for each frequency band, 3 channels including the upper, middle, and lower need to be measured according to the CTIA test methodology). Furthermore, these tests need to be performed continuously during the commissioning phase, and multiple prototypes (usually more than 5) drew from multiple batches have to be tested during the production validation phase. The anechoic chamber used for OTA tests, rather, may typically cost up to 10 million RMB, with the test price ranging from 1000-3000 RMB per hour. The lengthy test may probably cause enormous cost and pressure on the test resources.

Hence the prior art has yet to be improved and developed.

SUMMARY OF THE DISCLOSURE

In view of the deficiencies existing in the prior art, one objective of the disclosure is to provide antenna test methods and apparatuses for mobile terminals, to address the problems in existing antenna test methods, including overlong test duration, low efficiency, and high cost.

One technical solution adopted by the disclosure is as follows.

An antenna test method for mobile terminals may comprise the following steps: A, placing a mobile terminal under test on a turntable in an anechoic chamber, and connecting the mobile terminal to a base station emulator via an anechoic chamber communication antenna; B, moving, by the turntable, sequentially to multiple theta and phi angles, transmitting, by the base station emulator, signals to the mobile terminal via an anechoic chamber measurement antenna, and receiving and decoding by the mobile terminal the signals and transmitting them back to the base station emulator, to obtain the horizontal and vertical polarization data of the anechoic chamber measurement antenna at steps of a first angle; C, using a two-dimensional interpolation algorithm to calculate the corresponding data at steps of a second angle as the step converts from the first angle to the second angle, wherein the second angle is smaller than the first angle, and comparing, by the base station emulator, the bits in the transmitted and received data packets and so calculating a bit error rate (BER), when the BER exceeds the standard threshold, then the current radiated power of the base station emulator would be the Effective Isotropic Sensitivity (EIS) of the current test position, and the Total Isotropic Sensitivity (TIS) can be obtained through integration.

The step C in the above antenna test method may comprise specifically:

converting the data of each column from at steps of 45 degrees to 30 degrees:

$$\begin{cases} EIS_{30}^{phi} = EIS_{45}^{phi}, \text{ when } phi = 0, 90, 180, 270 \\ EIS_{30}^{phi} = EIS_{45}^{phi-1}/3 + EIS_{45}^{phi+1}*2/3, \text{ when } phi = 30, 120, 210, 300; phi-1 = 0, 90, 180, 270; phi+1 = 45, 135, 225, 315; \\ EIS_{30}^{phi} = EIS_{45}^{phi-1}*2/3 + EIS_{45}^{phi+1}/3, \text{ when } phi = 60, 150, 240, 330; phi-1 = 45, 135, 225, 315; phi+1 = 90, 180, 270, 0 \end{cases}$$

$EIS_{30}^{phi}$ is the data at steps of 30 degrees with a fixed theta angle, whilst $EIS_{45}^{phi}$ is the data at steps of 45 degrees also with the fixed theta angle.

The step C in the above antenna test method may comprise further:

converting the data of each row from at steps of 45 degrees to 30 degrees:

$$\begin{cases} EIS_{30}^{theta} = EIS_{45}^{theta}, \text{ when } phi = 90 \\ EIS_{30}^{theta} = EIS_{45}^{theta-1} * 2/3 + EIS_{45}^{theta+1}/3, \text{ when } theta = 60; theta - 1 = 45; theta + 1 = 90 \\ EIS_{30}^{theta} = EIS_{45}^{theta-1}/3 + EIS_{45}^{theta+1} * 2/3, \text{ when } theta = 120; theta - 1 = 90; theta + 1 = 135 \end{cases}$$

$EIS_{30}^{theta}$ is the data at steps of 30 degrees with a fixed phi angle, whilst $EIS_{45}^{theta}$ is the data at steps of 45 degrees also with the fixed phi angle.

The step C in the above antenna test method may comprise further, after having obtained the EIS of each test position:

compensating the path loss in the anechoic chamber to the EIS, and performing integration to derive the TIS.

The step B in the above antenna test method may further comprise: reducing gradually at each test position the radiated power of the base station emulator and transmitting data packets of a fixed length and of random contents, and receiving by the mobile terminal the data packets and transmitting them back to the base station emulator through a transmission path.

Another technical solution comprises an antenna test method for mobile terminals, including the following steps:

A, placing a mobile terminal on a turntable in an anechoic chamber, and connecting the mobile terminal to a base station emulator via an anechoic chamber communication antenna;

B, moving, by the turntable, sequentially to multiple theta and phi angles, transmitting, by the base station emulator, signals to the mobile terminal via an anechoic chamber measurement antenna, and receiving and decoding by the mobile terminal the signals and transmitting them back to the base station emulator, to obtain the horizontal and vertical polarization data of the anechoic chamber measurement antenna at steps of a first angle;

C, performing interpolations to calculate the corresponding data at steps of a second angle as the step converts from the first angle to the second angle, wherein the second angle is smaller than the first angle, and performing integration with the data to obtain the TIS.

In the step C of the above antenna test method, the interpolations may be implemented as a two-dimensional interpolation algorithm.

The step C in the above antenna test method may comprise specifically:

converting the data of each column from steps of 45 degrees to 30 degrees:

$EIS_{30}^{phi}$ is the data at steps of 30 degrees with a fixed theta angle, whilst $EIS_{45}^{phi}$ is the data at steps of 45 degrees also with the fixed theta angle.

The step C in the above antenna test method may comprise further:

converting the data of each row from steps of 45 degrees to 30 degrees:

$$\begin{cases} EIS_{30}^{theta} = EIS_{45}^{theta}, \text{ when } phi = 90 \\ EIS_{30}^{theta} = EIS_{45}^{theta-1} * 2/3 + EIS_{45}^{theta+1}/3, \text{ when } theta = 60; theta - 1 = 45; theta + 1 = 90 \\ EIS_{30}^{theta} = EIS_{45}^{theta-1}/3 + EIS_{45}^{theta+1} * 2/3, \text{ when } theta = 120; theta - 1 = 90; theta + 1 = 135 \end{cases}$$

$EIS_{30}^{theta}$ is the data at steps of 30 degrees with a fixed phi angle, whilst $EIS_{45}^{theta}$ is the data at steps of 45 degrees also with the fixed phi angle.

The step C in the above antenna test method may comprise further:

comparing, by the base station emulator, the bits in the transmitted and received data packets and so calculating the bit error rate (BER), when the BER exceeds a standard threshold, the current radiated power of the base station emulator would be the EIS of the current test position.

The step C in the above antenna test method may comprise further:

after having obtained the EIS of each test position, compensating the path loss in the anechoic chamber to the EIS, and performing integration to derive the TIS.

The step B in the above antenna test method may further comprise: reducing gradually at each test position the radiated power of the base station emulator and transmitting data packets of a fixed length and of random contents, and receiving by the mobile terminal the data packets and transmitting them back to the base station emulator through a transmission path.

Yet another technical solution provides an antenna test apparatus for mobile terminals, comprising:

a turntable located in an anechoic chamber and configured to place a mobile terminal under test;

a base station emulator connected to the mobile terminal via an anechoic chamber communication antenna;

wherein the turntable may move sequentially to multiple theta and phi angles, the base station emulator may transmit signals to the mobile terminal through an anechoic chamber measurement antenna, and the mobile terminal may receive and decode the signals and transmit them back to the base station emulator, to obtain the horizontal and vertical polarization data of the anechoic chamber measurement antenna at steps of a first angle;

$$\begin{cases} EIS_{30}^{phi} = EIS_{45}^{phi}, \text{ when } phi = 0, 90, 180, 270 \\ EIS_{30}^{phi} = EIS_{45}^{phi-1}/3 + EIS_{45}^{phi+1} * 2/3, \text{ when } phi = 30, 120, 210, 300; phi - 1 = 0, 90, 180, 270; phi + 1 = 45, 135, 225, 315; \\ EIS_{30}^{phi} = EIS_{45}^{phi-1} * 2/3 + EIS_{45}^{phi+1}/3, \text{ when } phi = 60, 150, 240, 330; phi - 1 = 45, 135, 225, 315; phi + 1 = 90, 180, 270, 0 \end{cases}$$

a data computation module configured to perform interpolations to calculate the corresponding data at steps of a second angle as the step is converted from the first angle to the second angle, wherein the second angle is smaller than the first angle, and perform integration with the data to obtain the TIS.

The data computation module may comprise:

a data column conversion unit configured to convert the data of each column from at steps of 45 degrees to 30 degrees;

$$\begin{cases} EIS_{30}^{phi} = EIS_{45}^{phi}, \text{ when } phi = 0, 90, 180, 270 \\ EIS_{30}^{phi} = EIS_{45}^{phi-1}/3 + EIS_{45}^{phi+1}*2/3, \text{ when } phi = 30, 120, 210, 300; phi-1 = 0, 90, 180, 270; phi+1 = 45, 135, 225, 315 ; \\ EIS_{30}^{phi} = EIS_{45}^{phi-1}*2/3 + EIS_{45}^{phi+1}/3, \text{ when } phi = 60, 150, 240, 330; phi-1 = 45, 135, 225, 315; phi+1 = 90, 180, 270, 0 \end{cases}$$

$EIS_{30}^{phi}$ is the data at steps of 30 degrees with a fixed theta angle, whilst $EIS_{45}^{phi}$ is the data at steps of 45 degrees also with the fixed theta angle.

The data computation module may further comprise:

a data row conversion unit configured to convert the data of each row from at steps of 45 degrees to 30 degrees;

$$\begin{cases} EIS_{30}^{theta} = EIS_{45}^{theta}, \text{ when } phi = 90 \\ EIS_{30}^{theta} = EIS_{45}^{theta-1}*2/3 + EIS_{45}^{theta+1}/3, \text{ when } theta = 60; theta-1 = 45; theta+1 = 90 \\ EIS_{30}^{theta} = EIS_{45}^{theta-1}/3 + EIS_{45}^{theta+1}*2/3, \text{ when } theta = 120; theta-1 = 90; theta+1 = 135 \end{cases}$$

$EIS_{30}^{theta}$ is the data at steps of 30 degrees with a fixed phi angle, whilst $EIS_{45}^{theta}$ is the data at steps of 45 degrees also with the fixed phi angle.

Advantages of the disclosure may follow: the actual test results at steps of a smaller second angle can be obtained by interpolating the data at steps of a first angle. Hence the solution provided by the disclosure can greatly reduce the test duration, and the error of the test results may still be acceptable, so the antenna test efficiency can be significantly improved and meanwhile the test cost can be effectively reduced.

DETAILED DESCRIPTION OF THE DISCLOSURE

Antenna test methods and apparatuses for mobile terminals are disclosed. To render the objectives, technical implementations, and effects of the disclosure more definite and unambiguous, hereinafter the disclosure will be described in further detail. It, however, should be appreciated that the specific embodiments as discussed are merely meant to better illustrate, but not to limit the present disclosure.

Figure 1:
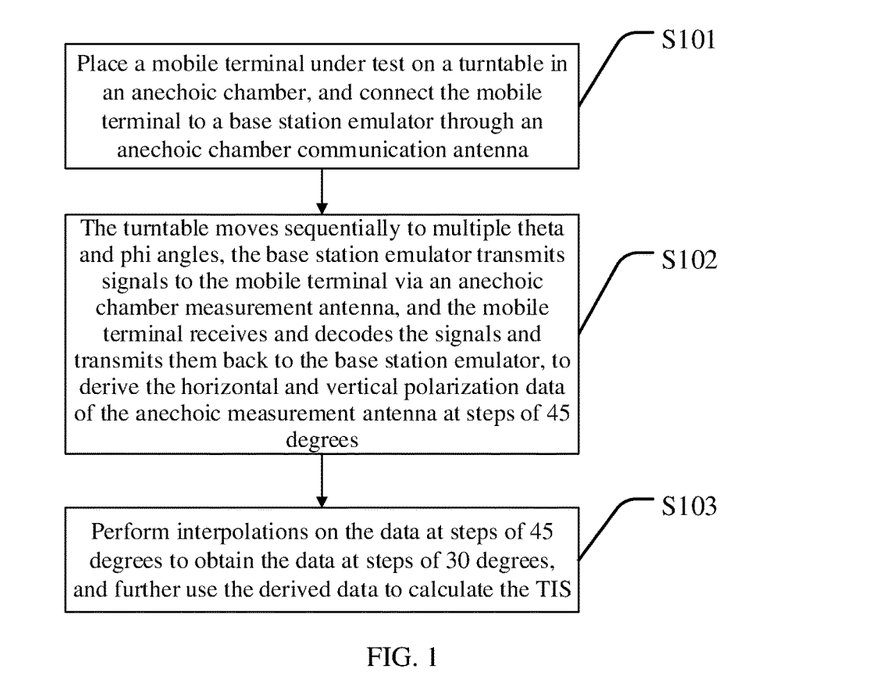
FIG. 1 is a flowchart illustrating an antenna test method for mobile terminals according to an exemplary embodiment of the disclosure.

Referring now to FIG. 1, which is a flowchart illustrating an antenna test method for mobile terminals according to an exemplary embodiment. The antenna test method may comprise the following steps.

In a first step S1, a mobile terminal under test is placed on a turntable in an anechoic chamber, and the mobile terminal is further connected to a base station emulator through an anechoic chamber communication antenna. The antenna test method can then proceed to step S2.

In the following step S2, the turntable can move sequentially to multiple theta and phi angles, which are two of the three spherical coordinates (the other being the radial distance r) as commonly used in a spherical coordinate system, wherein theta is the polar angle θ and phi is the azimuthal angle φ. The base station emulator can transmit signals to the mobile terminal through an anechoic chamber measurement antenna. The mobile terminal can receive and decode the signals, and transmit them back to the base station emulator to obtain the horizontal and vertical polarization data of the anechoic chamber measurement antenna at steps of a first angle. The method may then continue to step S3.

In the following step S3, interpolations are carried out to calculate the corresponding data at steps of a second angle as the step is converted from the first angle to the second angle. The derived data can then be used to calculate the Total Isotropic Sensitivity (TIS).

Herein below steps of the above method will be illustrated in further detail, in which the first angle is selected as 45 degrees, whilst the second angle as 30 degrees. It is obvious, however, that the first and second angles shall not be limited thereto. For example, the first angle can be 45 degrees whilst the second angle 15 degrees, or the first angle can be 30 degrees whilst the second angle 15 degrees, so long as these instances can achieve the purpose of improving the test efficiency and reducing the test cost.

In the above step S2, as the turntable in the anechoic chamber moves sequentially to different angles, the polarization (horizontal and vertical) of the anechoic chamber measurement antenna will be further adjusted. At each theta/phi position, the polarization (horizontal and vertical) of the anechoic chamber measurement antenna will be adjusted twice. In conventional test methods, the theta angle of the turntable may need to move from 0 degrees to 180 degrees through 6 steps, each step spanning 30 degrees. Likewise, the angle phi may need to move from 0 degrees to 360 degrees through 12 steps, each spanning 30 degrees. For each angular position, both the horizontal and vertical polarizations of the anechoic chamber measurement antenna may need to be tested. Hence the number of the total test positions would be 6*12*2=144. At each test position, the test system may gradually reduce the radiated power of the base station emulator, and after each radiated power reduction data packets of a fixed length and of random contents can be transmitted. The mobile terminal can receive these data packets and send them back to the base station emulator through a transmission path. Thus, the horizontal and vertical polarization data of the anechoic chamber measurement antenna at steps of 45 degrees can be so obtained.

In the above step S3, the base station emulator may compare the bits in the transmitted data packets against those in the received data packets, and thus calculate the bit error rate (BER). When the BER exceeds a standard threshold (according to the 3GPP standard, the BER standard of the Global System for Mobile Communications (GSM) shall be below 2.44%, the BER standard of the Wideband Code Division Multiple Access (WCDMA) system shall be below 0.1%, whilst the Long Term Evolution (LTE) requires the throughput to be above 96%), the current radiated power of the base station emulator would be the Effective Isotropic Sensitivity (EIS) of the current test position.

After having obtained the EIS of each test position, the path loss in the anechoic chamber (the path loss is a fixed deviation value at a fixed frequency position and polarization of the anechoic chamber measurement antenna) can be compensated to the EIS, and the TIS can be derived through integration. The calculating equation can be as follows:

$$TIS \cong \frac{2NM}{\pi \sum_{i=1}^{N-1} \sum_{j=0}^{M-1} \left[ \frac{1}{EIS_\theta(\theta_i, \phi_i)} + \frac{1}{EIS_\phi(\theta_i, \phi_i)} \right] \sin(\theta_i)};$$

The angles θ and φ are measured about a rotation axis respectively perpendicular and parallel to the turntable plane, and N and M are the sampling points along the θ and φ polarized directions, N=6 and M=12.

According to the disclosure, tests at intervals of 45 degrees and 30 degrees may first be carried out, and the test results are as shown in table 1 (horizontal polarization) and table 2 (vertical polarization). The tables 1 and 2 actually display the data at steps of 45 degrees, in which each column represents the original test data at each test position derived as the turntable maintains a fixed theta angle and rotates to different phi angles. Likewise, table 3 (horizontal polarization) and table 4 (vertical polarization) display the data at steps of 30 degrees. From the tables we can observe that the two angular steps yield results of little differences as well as results of relatively big differences (>1.45 dB), that is, in some antenna tests deviations above 1.45 dB may occur between steps of 30 degrees and 45 degrees, thus the results at steps of 45 degrees cannot be adopted directly for those at steps of 30 degrees.

TABLE 1

| Original data at steps of 45 degrees | 0 | 45 | 90 | 135 |
|---|---|---|---|---|
| 0 | −125.502 | −123.502 | −125.502 | −128.502 |
| 45 | −121.502 | −119.502 | −121.502 | −124.502 |
| 90 | −105.502 | −92.5016 | −105.502 | −102.502 |
| 135 | −118.502 | −118.502 | −118.502 | −123.502 |
| 180 | −123.502 | −122.502 | −123.502 | −126.502 |
| 225 | −119.502 | −118.502 | −119.502 | −123.502 |
| 270 | −101.502 | −103.502 | −101.502 | −93.5016 |
| 315 | −122.502 | −120.502 | −122.502 | −124.502 |

TABLE 2

| Original data at steps of 45 degrees | 0 | 45 | 90 | 135 |
|---|---|---|---|---|
| 0 | −99.6237 | −117.624 | −99.6237 | −110.624 |
| 45 | −116.624 | −119.624 | −116.624 | −123.624 |
| 90 | −118.624 | −120.624 | −118.624 | −126.624 |
| 135 | −117.624 | −120.624 | −117.624 | −123.624 |
| 180 | −104.624 | −116.624 | −104.624 | −107.624 |
| 225 | −116.624 | −110.624 | −116.624 | −121.624 |
| 270 | −118.624 | −110.624 | −118.624 | −125.624 |
| 315 | −116.624 | −110.624 | −116.624 | −123.624 |

TABLE 3

| Original data at steps of 30 degrees | 0 | 30 | 60 | 90 | 120 | 150 |
|---|---|---|---|---|---|---|
| 0 | −122.502 | −123.502 | −125.502 | −126.502 | −120.502 |
| 30 | −120.502 | −122.502 | −124.502 | −124.502 | −119.502 |
| 60 | −115.502 | −116.502 | −118.502 | −118.502 | −115.502 |
| 90 | −97.5016 | −101.502 | −105.502 | −103.502 | −105.502 |
| 120 | −114.502 | −122.502 | −114.502 | −115.502 | −108.502 |
| 150 | −119.502 | −119.502 | −121.502 | −121.502 | −115.502 |
| 180 | −121.502 | −120.502 | −123.502 | −123.502 | −118.502 |
| 210 | −120.502 | −119.502 | −121.502 | −122.502 | −118.502 |
| 240 | −115.502 | −113.502 | −115.502 | −117.502 | −114.502 |
| 270 | −92.5016 | −100.502 | −102.502 | −96.5016 | −94.5016 |
| 300 | −116.502 | −116.502 | −119.502 | −119.502 | −113.502 |
| 330 | −121.502 | −121.502 | −124.502 | −124.502 | −119.502 |

TABLE 4

| Original data at steps of 30 degrees | 0 | 30 | 60 | 90 | 120 | 150 |
|---|---|---|---|---|---|---|
| 0 | −115.624 | −115.624 | −100.624 | −110.624 | −107.624 |
| 30 | −116.624 | −120.624 | −112.624 | −119.624 | −114.624 |
| 60 | −117.624 | −121.624 | −117.624 | −122.624 | −118.624 |
| 90 | −118.624 | −122.624 | −118.624 | −123.624 | −119.624 |
| 120 | −117.624 | −122.624 | −118.624 | −122.624 | −118.624 |
| 150 | −116.624 | −120.624 | −114.624 | −119.624 | −114.624 |
| 180 | −115.624 | −114.624 | −104.624 | −110.624 | −98.6237 |
| 210 | −116.624 | −103.624 | −114.624 | −111.624 | −114.624 |
| 240 | −118.624 | −114.624 | −118.624 | −119.624 | −119.624 |
| 270 | −118.624 | −116.624 | −118.624 | −121.624 | −121.624 |
| 300 | −118.624 | −113.624 | −118.624 | −120.624 | −120.624 |
| 330 | −116.624 | −104.624 | −114.624 | −114.624 | −116.624 |

To improve the TIS test efficiency, the data acquired at steps of 45 degrees can be interpolated to obtain the data at steps of 30 degrees, that means the test results obtained at steps of 45 degrees can be performed interpolations to get the test results for steps of 30 degrees.

The interpolations as used can be implemented as a two-dimensional interpolation algorithm. Herein below the interpolation process will be described in further detail.

The step S3 may comprise specifically:

converting the data of each column from at steps of 45 degrees to 30 degrees:

$$\begin{cases} EIS_{30}^{phi} = EIS_{45}^{phi}, \text{ when } phi = 0, 90, 180, 270 \\ EIS_{30}^{phi} = EIS_{45}^{phi-1}/3 + EIS_{45}^{phi+1} * 2/3, \text{ when } phi = 30, 120, 210, 300; phi - 1 = 0, 90, 180, 270; phi + 1 = 45, 135, 225, 315; \\ EIS_{30}^{phi} = EIS_{45}^{phi-1} * 2/3 + EIS_{45}^{phi+1}/3, \text{ when } phi = 60, 150, 240, 330; phi - 1 = 45, 135, 225, 315; phi + 1 = 90, 180, 270, 0 \end{cases}$$

$EIS_{30}^{phi}$ is the data at steps of 30 degrees with a fixed theta angle, whilst $EIS_{45}^{phi}$ is the data at steps of 45 degrees also with the fixed theta angle.

Table 5 (horizontal polarization) and table 6 (vertical polarization) display the original data at steps of 45 degrees, whilst table 7 (horizontal polarization) and table 8 (vertical polarization) present the data for 30-degree steps derived through interpolations.

TABLE 5

| Original data at steps of 45 degrees | 0 | 45 | 90 | 135 |
|---|---|---|---|---|
| 0 | −124.082 | −121.082 | −124.082 | −126.082 |
| 45 | −119.082 | −115.082 | −119.082 | −122.082 |
| 90 | −101.082 | −96.082 | 101-.082 | −101.082 |
| 135 | −117.082 | −114.082 | −117.082 | −121.082 |
| 180 | −121.082 | −120.082 | −121.082 | −125.082 |
| 225 | −117.082 | −116.082 | −117.082 | −121.082 |
| 270 | −106.082 | −106.082 | −106.082 | −106.082 |
| 315 | −122.082 | −120.082 | −122.082 | −123.082 |

TABLE 6

| Original data at steps of 45 degrees | 0 | 45 | 90 | 135 |
|---|---|---|---|---|
| 0 | −110.781 | −118.781 | −110.781 | −110.781 |
| 45 | −117.781 | −119.781 | −117.781 | −122.781 |
| 90 | −118.781 | 120-.781 | −118.781 | −124.781 |
| 135 | −117.781 | −119.781 | −117.781 | −121.781 |
| 180 | −109.781 | −117.781 | −109.781 | −102.781 |
| 225 | −115.781 | −115.781 | −115.781 | −120.781 |
| 270 | −118.781 | −116.781 | −118.781 | −123.781 |
| 315 | −113.781 | −116.781 | −113.781 | −120.781 |

TABLE 7

| Data derived through column interpolations | 0 | 45 | 90 | 135 |
|---|---|---|---|---|
| 0 | −124.084 | −121.082 | −124.082 | −126.082 |
| 30 | −120.7 | −117.1 | −120.7 | −123.4 |
| 60 | −113.1 | −108.7 | −113.1 | −115.1 |
| 90 | −101.1 | −96.1 | −101.1 | −101.1 |
| 120 | −111.7 | −108.1 | −111.7 | −114.4 |
| 150 | −118.4 | −116.1 | −118.4 | −122.4 |
| 180 | −121.1 | −120.1 | −121.1 | −125.1 |
| 210 | −118.4 | −117.4 | −118.4 | −122.4 |
| 240 | −113.4 | −112.7 | −113.4 | −116.1 |

TABLE 7-continued

| Data derived through column interpolations | 0 | 45 | 90 | 135 |
|---|---|---|---|---|
| 270 | −106.1 | −106.1 | −106.1 | −106.1 |
| 300 | −116.7 | −115.4 | −116.7 | −117.4 |
| 330 | −122.7 | −120.4 | −122.7 | −124.1 |

TABLE 8

| Data derived through column interpolations | 0 | 45 | 90 | 135 |
|---|---|---|---|---|
| 0 | −110.781 | −110.781 | −110.781 | −110.781 |
| 30 | −115.4 | −119.4 | −115.4 | −118.8 |
| 60 | −118.1 | −120.1 | −118.1 | −123.4 |
| 90 | −118.8 | −120.8 | −118.8 | −124.8 |
| 120 | −118.1 | −120.1 | −118.1 | −122.8 |
| 150 | −115.1 | −119.1 | −115.1 | −115.4 |
| 180 | −109.8 | −117.8 | −109.8 | −102.8 |
| 210 | −113.8 | −116.4 | −113.8 | −114.8 |
| 240 | −116.8 | −116.1 | −116.8 | −121.8 |
| 270 | −118.8 | −116.8 | −118.8 | −123.8 |
| 300 | −115.4 | −116.8 | −115.4 | −121.8 |
| 330 | −112.8 | −117.4 | −112.8 | −117.4 |

The step S3 may further comprise:

converting the data of each row from at steps of 45 degrees to 30 degrees:

$$\begin{cases} EIS_{30}^{theta} = EIS_{45}^{theta}, \text{ when } phi = 90 \\ EIS_{30}^{theta} = EIS_{45}^{theta-1} * 2/3 + EIS_{45}^{theta+1}/3, \text{ when } theta = 60; theta - 1 = 45; theta + 1 = 90 \\ EIS_{30}^{theta} = EIS_{45}^{theta-1}/3 + EIS_{45}^{theta+1} * 2/3, \text{ when } theta = 120; theta - 1 = 90; theta + 1 = 135 \end{cases}$$

$EIS_{30}^{theta}$ is the data at steps of 30 degrees with a fixed phi angle, whilst $EIS_{45}^{theta}$ is the data at steps of 45 degrees also with the fixed phi angle.

Tables 9 and 10 display the data derived by interpolating the data as shown in tables 7 and 8, respectively.

TABLE 9

| Data derived through row interpolations | 0 | 30 | 60 | 90 | 120 | 150 |
|---|---|---|---|---|---|---|
| 0 | −124.082 | −122.1 | −122.1 | −124.082 | −125.4 | −125.4 |
| 30 | −120.749 | −118.3 | −118.3 | −120.749 | −122.5 | −122.5 |

TABLE 9-continued

| Data derived through row interpolations | 0 | 30 | 60 | 90 | 120 | 150 |
|---|---|---|---|---|---|---|
| 60 | −113.082 | −110.2 | −110.2 | −113.082 | −114.4 | −114.4 |
| 90 | −101.082 | −97.7 | −97.7 | −101.082 | −101.1 | −101.1 |
| 120 | −111.749 | −109.3 | −109.3 | −111.749 | −113.5 | −113.5 |
| 150 | −118.415 | −116.9 | −116.9 | −118.415 | −121.1 | −121.1 |
| 180 | −121.082 | −120.4 | −120.4 | −121.082 | −123.7 | −123.7 |
| 210 | −118.415 | −117.1 | −117.7 | −118.415 | −121.1 | −121.1 |
| 240 | −113.415 | −113.0 | −113.0 | −113.415 | −115.2 | −115.2 |
| 270 | −106.082 | −106.1 | −106.1 | −106.082 | −106.1 | −106.1 |
| 300 | −116.749 | −115.9 | −115.9 | −116.749 | −117.2 | −117.2 |
| 330 | −122.749 | −121.2 | −121.2 | −122.749 | −123.6 | −123.6 |

TABLE 10

| Data derived through row interpolations | 0 | 30 | 60 | 90 | 120 | 150 |
|---|---|---|---|---|---|---|
| 0 | −110.781 | −116.1 | −116.1 | −110.781 | −110.8 | −110.8 |
| 30 | −115.448 | −118.1 | −118.1 | −115.448 | −117.7 | −117.7 |
| 60 | −118.114 | −119.4 | −119.4 | −118.114 | −121.7 | −121.7 |
| 90 | −118.781 | −120.1 | −120.1 | −118.781 | −122.8 | −122.8 |
| 120 | −118.114 | −119.4 | −119.4 | −118.114 | −121.2 | −121.2 |
| 150 | −115.114 | −117.8 | −117.8 | −115.114 | −115.3 | −115.3 |
| 180 | −109.781 | −115.1 | −115.1 | −109.781 | −105.1 | −105.1 |
| 210 | −113.781 | −115.6 | −115.6 | −113.781 | −114.4 | −114.4 |
| 240 | −116.781 | −116.3 | −116.3 | −116.781 | −120.1 | −120.1 |
| 270 | −118.781 | −117.4 | −117.4 | −118.781 | −122.1 | −122.1 |
| 300 | −115.448 | −116.3 | −116.3 | −115.448 | −119.7 | −119.7 |
| 330 | −112.781 | −115.9 | −115.9 | −112.781 | −115.9 | −115.9 |

In the disclosure multiple terminals can be performed the antenna TIS tests and interpolations. The differences that are above 1.5 dB between the test results at steps of 45 and 30 degrees, are now narrowed to around 0.5-0.6 dB.

To further verify the reliability of the disclosure, OTA tests are carried out with 9 groups of different frequency bands and different terminals, the test data is as shown in the following table 11.

TABLE 11

|  | #1 | #2 | #3 | #4 | #5 | #6 | #7 | #8 | #9 |
|---|---|---|---|---|---|---|---|---|---|
| Tests with steps of 30 degrees | −93.2418 | −92.8983 | −93.2901 | −92.0083 | −93.2557 | −92.6567 | −93.1764 | −94.5109 | −94.557 |
| Tests with steps of 45 degrees | −93.7511 | −92.7742 | −93.1957 | −93.1387 | −94.5867 | −94.1653 | −94.648 | −96.0861 | −96.1032 |
| Differences between 45 and 30-degree steps | −0.50928 | 0.124069 | 0.094417 | −1.13044 | −1.33101 | −1.5086 | −1.47154 | −1.57523 | −1.5462 |
| Interpolation results with steps of 45 degrees | −92.5506 | −92.9454 | −92.5551 | −91.9943 | −93.4439 | −93.0555 | −93.7727 | −95.1748 | −94.8986 |
| Difference between 45-degree interpolation and 30-degree data | 0.691177 | −0.04706 | 0.735061 | 0.014034 | −0.18814 | −0..39887 | −0.59628 | −0.66398 | −0.34158 |

The differences between the 45-degree interpolation resultant data and 30-degree data, together with the differences between data at steps of 45 degrees and 30 degrees are as shown in FIG. 1. It can be observed from the figure that the differences between the 45-degree interpolation resultant data and 30-degree data has been controlled within 0.7 dB.

To further save the test time, in the test with steps of 45 degrees, the theta of 0 degrees of the turntable may not be tested (because the data of this column does not contribute to the calculation of the TIS). Meanwhile, two columns of interpolated data at theta of 30 and 150 degrees are also ignored. The specific results are as shown in the following table 14.

TABLE 14

|  | # 1 | # 2 | # 3 | # 4 | # 5 | # 6 | # 7 | # 8 | # 9 |
|---|---|---|---|---|---|---|---|---|---|
| Tests with steps of 30 degrees | −93.2418 | −92.8983 | −93.2901 | −92.0083 | −93.2557 | −92.6567 | −93.1764 | −94.5109 | −94.557 |
| Tests with steps of 45 degrees | −93.7511 | −92.7742 | −93.1957 | −93.1387 | −94.5867 | −94.1653 | −94.648 | −96.0861 | −96.1032 |
| Differences between 45- and 30-degree steps | −0.50928 | 0.124069 | 0.094417 | −1.13044 | −1.33101 | −1.5086 | −1.47154 | −1.57523 | −1.5462 |
| Interpolation results at steps of 45 degrees (eliminating 0-degree) | −92.8538 | −93.6092 | −92.9185 | −92.2483 | −93.7067 | −93.3286 | −94.0712 | −95.5098 | −95.178 |
| Differences between 45-degree interpolation (eliminating 0-degree) and 30-degree | 0.387965 | −0.70455 | 0.371631 | −0.24 | −0.45097 | −0.67196 | −0.89476 | −0.99892 | −0.62105 |

Figure 2:
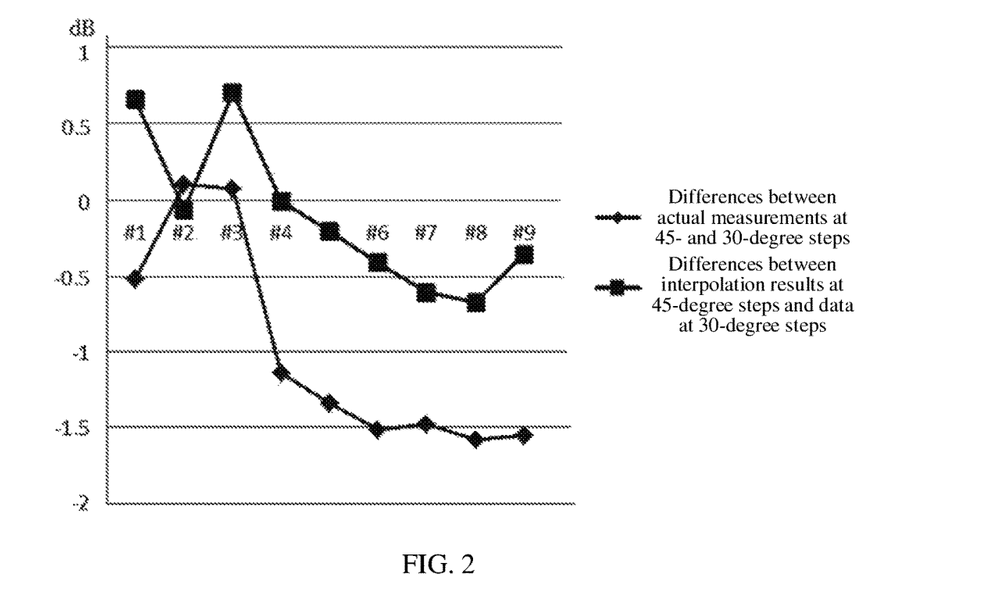
FIG. 2 is a schematic diagram illustrating the comparison of data according to an embodiment of the antenna test method.
Figure 3:
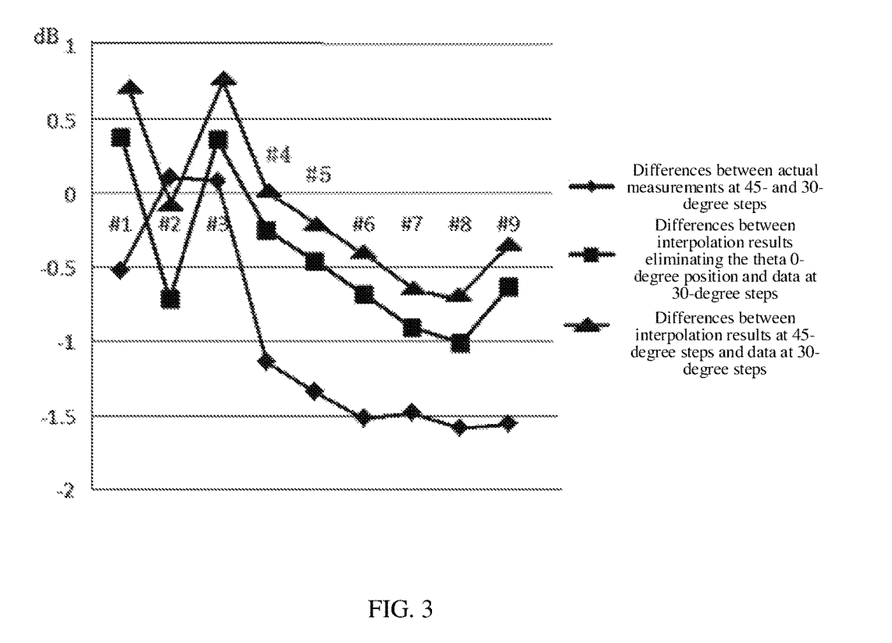
FIG. 3 is a schematic diagram illustrating the comparison of data according to another embodiment of the antenna test method.

The differences between the 45-degree interpolation resultant data and 30-degree data, the differences between the interpolation results eliminating 0-degree position and the 30-degree data, together with the differences between data at steps of 45 degrees and 30 degrees are as shown in FIG. 2. It can be observed from the figure the method can effectively save the test time and can achieve better test efficiency, however, the differences with data at 30-degree steps has expanded to 1 dB. Thus in actual use the interpolation algorithm can be selected as desired.

Based on the above method, an antenna test apparatus for mobile terminals is further disclosed. The antenna test apparatus may comprise:

an turntable located in an anechoic chamber and configured to place a mobile terminal under test;

a base station emulator connected to the mobile terminal via an anechoic chamber communication antenna;

wherein the turntable may move sequentially to multiple theta and phi angles, the base station emulator may transmit signals to the mobile terminal through an anechoic chamber measurement antenna, and the mobile terminal may receive and decode the signals, and further transmit them back to the base station emulator, to obtain the horizontal and vertical polarization data of the anechoic chamber measurement antenna at steps of a first angle;

a data computation module configured to perform interpolations to calculate the corresponding data at steps of a second angle as the step converts from the first angle to the second angle, and then use the derived data to calculate the TIS.

The data computation module may comprise:

a data column conversion unit configured to convert the data of each column from at steps of 45 degrees to 30 degrees;

$$\begin{cases} EIS_{30}^{phi} = EIS_{45}^{phi}, \text{ when } phi = 0, 90, 180, 270 \\ EIS_{30}^{phi} = EIS_{45}^{phi-1}/3 + EIS_{45}^{phi+1} * 2/3, \text{ when } phi = 30, 120, 210, 300; phi-1 = 0, 90, 180, 270; phi+1 = 45, 135, 225, 315; \\ EIS_{30}^{phi} = EIS_{45}^{phi-1} * 2/3 + EIS_{45}^{phi+1}/3, \text{ when } phi = 60, 150, 240, 330; phi-1 = 45, 135, 225, 315; phi+1 = 90, 180, 270, 0 \end{cases}$$

$EIS_{30}^{phi}$ is the data at steps of 30 degrees with a fixed theta angle, whilst $EIS_{45}^{phi}$ is the data at steps of 45 degrees also with the fixed theta angle.

The data computation module may further comprise:

a data row conversion unit configured to convert the data of each row from at steps of 45 degrees to 30 degrees;

$$\begin{cases} EIS_{30}^{theta} = EIS_{45}^{theta}, \text{ when } phi = 90 \\ EIS_{30}^{theta} = EIS_{45}^{theta-1} * 2/3 + EIS_{45}^{theta+1}/3, \text{ when } theta = 60; theta-1 = 45; theta+1 = 90 \\ EIS_{30}^{theta} = EIS_{45}^{theta-1}/3 + EIS_{45}^{theta+1} * 2/3, \text{ when } theta = 120; theta-1 = 90; theta+1 = 135 \end{cases}$$

$EIS_{30}^{theta}$ is the data at steps of 30 degrees with a fixed phi angle, whilst $EIS_{45}^{theta}$ is the data at steps of 45 degrees also with the fixed phi angle.

In conclusion, according to the disclosure the actual test results with steps of a smaller second angle can be obtained by interpolating the data derived at steps of a first angle. Hence the solution provided by the disclosure can greatly reduce the test duration, and the error of the test results may still be acceptable, so the antenna test efficiency can be significantly improved and meanwhile the test cost can be effectively reduced.

It, however, should be appreciated that the application of the present disclosure shall not be limited to the examples raised above, and those of ordinary skill in the art can make various improvements or transformations to the above description, all such improvements and modifications shall all fall in the protection range specified by the appended claims of the present disclosure.

The invention claimed is:

1. An antenna test method for mobile terminals, comprising:
placing a mobile terminal under test on a turntable in an anechoic chamber, and connecting the mobile terminal to a base station emulator via an anechoic chamber communication antenna;
moving, by the turntable, sequentially to a plurality of theta and phi angles;
sending, by the base station emulator, signals to the mobile terminal via an anechoic chamber measurement antenna;
receiving and decoding, by the mobile terminal, the signals and sending the signals back to the base station emulator to obtain horizontal and vertical polarization data of the anechoic chamber measurement antenna at steps of a first angle;
using a two-dimensional interpolation algorithm to calculate the horizontal and vertical polarization data at steps of a second angle as the step converts from the first angle to the second angle, wherein the second angle is smaller than the first angle; and
comparing, by the base station emulator, bits in transmitted and received data packets to calculate a bit error rate (BER); when the BER exceeds a standard threshold, a current radiated power of the base station emulator is an Effective Isotropic Sensitivity (EIS) of a current test position, and a Total Isotropic Sensitivity (TIS) is obtained through integration;
wherein the first angle is 45 degrees and the second angle is 30 degrees, and the method further comprises: converting the data of each column at steps of 45 degrees to 30 degrees:

$$\begin{cases} EIS_{30}^{phi} = EIS_{45}^{phi}, \text{ when } phi = 0, 90, 180, 270 \\ EIS_{30}^{phi} = EIS_{45}^{phi-1}/3 + EIS_{45}^{phi+1}*2/3, \text{ when} \\ \quad phi = 30, 120, 210, 300; phi - 1 = 0, 90, 180, 270; \\ \quad phi + 1 = 45, 135, 225, 315 \\ EIS_{30}^{phi} = EIS_{45}^{phi-1}*2/3 + EIS_{45}^{phi+1}/3, \text{ when} \\ \quad phi = 60, 150, 240, 330; phi - 1 = 45, 135, 225, 315; \\ \quad phi + 1 = 90, 180, 270, 0 \end{cases};$$

wherein $EIS_{30}^{phi}$ is the data at steps of 30 degrees with a fixed theta angle, whilst $EIS_{45}^{phi}$ is the data at steps of 45 degrees also with the fixed theta angle.

2. The antenna test method according to claim 1, further comprising converting the data of each row at steps of 45 degrees to 30 degrees:

$$\begin{cases} EIS_{30}^{theta} = EIS_{45}^{theta}, \text{ when } phi = 90 \\ EIS_{30}^{theta} = EIS_{45}^{theta-1}*2/3 + EIS_{45}^{theta+1}/3, \text{ when } theta = 60; theta - 1 = 45; theta + 1 = 90 \\ EIS_{30}^{theta} = EIS_{45}^{theta-1}/3 + EIS_{45}^{theta+1}*2/3, \text{ when } theta = 120; theta - 1 = 90; theta + 1 = 135 \end{cases}$$

wherein $EIS_{30}^{theta}$ is the data at steps of 30 degrees with a fixed phi angle, whilst $EIS_{45}^{theta}$ is the data at steps of 45 degrees also with the fixed phi angle.

3. The antenna test method according to claim 2, wherein the test at the theta of 0 degrees is dropped.

4. The antenna test method according to claim 1, further comprising: after having obtained the EIS of each test position, compensating path loss in the anechoic chamber to the EIS, and deriving the TIS through the integration.

5. The antenna test method according to claim 1, further comprising:
reducing gradually at each test position the radiated power of the base station emulator and sending data packets of a fixed length and of random contents, and receiving by the mobile terminal the data packets and sending them back to the base station emulator through a transmission path.

6. The antenna test method according to claim 1, wherein the tests at the phi of 30 and 150 degrees are dropped.

7. An antenna test method for mobile terminals, comprising:
placing a mobile terminal under test on a turntable in an anechoic chamber, and connecting the mobile terminal to a base station emulator via an anechoic chamber communication antenna;
moving, by the turntable, sequentially to a plurality of theta and phi angles;
sending, by the base station emulator, signals to the mobile terminal via an anechoic chamber measurement antenna;
receiving and decoding, by the mobile terminal, the signals and sending them back to the base station emulator to obtain horizontal and vertical polarization data of the anechoic chamber measurement antenna at steps of a first angle;
performing interpolations to calculate corresponding data at steps of a second angle as the step converts from the step of the first angle to the step of the second angle, wherein the second angle is smaller than the first angle, and performing integration with the data to obtain a Total Isotropic Sensitivity (TIS);
wherein the first angle is 45 degrees and the second angle is 30 degrees, and the method further comprises: converting the data of each column at steps of 45 degrees to 30 degrees:

$$\begin{cases} EIS_{30}^{phi} = EIS_{45}^{phi}, \text{ when } phi = 0, 90, 180, 270 \\ EIS_{30}^{phi} = EIS_{45}^{phi-1}/3 + EIS_{45}^{phi+1}*2/3, \text{ when } phi = 30, 120, 210, 300; phi-1 = 0, 90, 180, 270; phi+1 = 45, 135, 225, 315; \\ EIS_{30}^{phi} = EIS_{45}^{phi-1}*2/3 + EIS_{45}^{phi+1}/3, \text{ when } phi = 60, 150, 240, 330; phi-1 = 45, 135, 225, 315; phi+1 = 90, 180, 270, 0 \end{cases}$$

wherein $EIS_{30}^{phi}$ is the data at steps of 30 degrees with a fixed theta angle, whilst $EIS_{45}^{phi}$ is the data at steps of 45 degrees also with the fixed theta angle.

8. The antenna test method according to claim 7, wherein the interpolations are implemented as a two-dimensional interpolation algorithm.

9. The antenna test method according to claim 8, further comprising converting the data of each row at steps of 45 degrees to 30 degrees:

$$\begin{cases} EIS_{30}^{theta} = EIS_{45}^{theta}, \text{ when } phi = 90 \\ EIS_{30}^{theta} = EIS_{45}^{theta-1}*2/3 + EIS_{45}^{theta+1}/3, \text{ when } theta = 60; theta-1 = 45; theta+1 = 90 \\ EIS_{30}^{theta} = EIS_{45}^{theta-1}/3 + EIS_{45}^{theta+1}*2/3, \text{ when } theta = 120; theta-1 = 90; theta+1 = 135 \end{cases}$$

wherein $EIS_{30}^{theta}$ is the data at steps of 30 degrees with a fixed phi angle, whilst $EIS_{45}^{theta}$ is the data at steps of 45 degrees also with the fixed phi angle.

10. The antenna test method according to claim 9, wherein the test at the theta of 0 degrees is dropped.

11. The antenna test method according to claim 7, further comprising: comparing, by the base station emulator, bits in transmitted and received data packets and so calculating a bit error rate (BER); when the BER exceeds a standard threshold, a current radiated power of the base station emulator is an Effective Isotropic Sensitivity (EIS) of a current test position.

12. The antenna test method according to claim 11, further comprising: after having obtained the EIS of each test position, compensating path loss of the anechoic chamber to the EIS, and deriving the Total Isotropic Sensitivity (TIS) through integration.

13. The antenna test method according to claim 7, further comprising: reducing gradually at each test position radiated power of the base station emulator and sending data packets having a fixed length and random contents, and receiving by the mobile terminal the data packets and sending them back to the base station emulator through a transmission path.

14. The antenna test method according to claim 7, wherein the tests at the phi of 30 and 150 degrees are dropped.

15. An antenna test apparatus for mobile terminals, comprising:

a turntable located in an anechoic chamber and configured to place a mobile terminal under test, the turntable moving sequentially to a plurality of theta and phi angles;

a base station emulator connected to the mobile terminal via an anechoic chamber communication antenna, the base station emulator transmitting signals to the mobile terminal through an anechoic chamber measurement antenna, and the mobile terminal receives and decodes the signals and transmits them back to the base station emulator, to obtain horizontal and vertical polarization data of the anechoic chamber measurement antenna at steps of a first angle; and a data computation module configured to perform interpolations to calculate corresponding data at steps of a second angle as the step converts from the first angle to the second angle, wherein the second angle is smaller than the first angle, and perform integration with the data to obtain a Total Isotropic Sensitivity (TIS);

wherein the data computation module comprises:

a data column conversion unit configured to convert the data of each column from at steps of 45 degrees to 30 degrees:

$$\begin{cases} EIS_{30}^{phi} = EIS_{45}^{phi}, \text{ when } phi = 0, 90, 180, 270 \\ EIS_{30}^{phi} = EIS_{45}^{phi-1}/3 + EIS_{45}^{phi+1}*2/3, \text{ when } phi = 30, 120, 210, 300; phi-1 = 0, 90, 180, 270; phi+1 = 45, 135, 225, 315; \\ EIS_{30}^{phi} = EIS_{45}^{phi-1}*2/3 + EIS_{45}^{phi+1}/3, \text{ when } phi = 60, 150, 240, 330; phi-1 = 45, 135, 225, 315; phi+1 = 90, 180, 270, 0 \end{cases}$$

wherein $EIS_{30}^{phi}$ is the data at steps of 30 degrees with a fixed theta angle, whilst $EIS_{45}^{phi}$ is the data at steps of 45 degrees also with the fixed theta angle.

16. The antenna test apparatus according to claim 15, wherein the data computation module further comprises:

a data row conversion unit configured to convert the data of each row at steps of 45 degrees to 30 degrees;

$$\begin{cases} EIS_{30}^{theta} = EIS_{45}^{theta}, \text{ when } phi = 90 \\ EIS_{30}^{theta} = EIS_{45}^{theta-1}*2/3 + EIS_{45}^{theta+1}/3, \text{ when } theta = 60; theta-1 = 45; theta+1 = 90 \\ EIS_{30}^{theta} = EIS_{45}^{theta-1}/3 + EIS_{45}^{theta+1}*2/3, \text{ when } theta = 120; theta-1 = 90; theta+1 = 135 \end{cases}$$

wherein $EIS_{30}^{theta}$ is the data at steps of 30 degrees with a fixed phi angle, whilst $EIS_{45}^{theta}$ is the data at steps of 45 degrees also with the fixed phi angle.

* * * * *